(12) United States Patent
West (10) Patent No.: US 7,761,751 B1
(45) Date of Patent: Jul. 20, 2010

(54) TEST AND DIAGNOSIS OF SEMICONDUCTORS

(75) Inventor: Burnell G. West, Half Moon Bay, CA (US)

(73) Assignee: Credence Systems Corporation, Milpitas, CA (US)

( * ) Notice: Subject to any disclaimer, the term of this patent is extended or adjusted under 35 U.S.C. 154(b) by 541 days.

(21) Appl. No.: 11/708,824

(22) Filed: Feb. 20, 2007

Related U.S. Application Data (60) Provisional application No. 60/799,929, filed on May 12, 2006.

(51) Int. Cl.
*G06F 11/00* (2006.01)
*G06F 17/50* (2006.01)
*G01R 31/28* (2006.01)

(52) U.S. Cl. .................. 714/703; 714/724; 716/4
(58) Field of Classification Search .......... 714/703, 714/724, 725, 733–734, 25–26, 31–33, 35–39, 714/46–47; 703/13–15, 22; 702/108, 117–119; 716/4–5
See application file for complete search history.

(56) References Cited

U.S. PATENT DOCUMENTS

| | | | |
|---|---|---|---|
| 4,433,919 A | 2/1984 | Hoppe | |
| 4,439,046 A | 3/1984 | Hoppe | |
| 4,719,608 A | 1/1988 | Genat et al. | |
| 5,212,443 A | 5/1993 | West et al. | |
| 5,430,400 A | 7/1995 | Herlein et al. | |
| 5,694,377 A | 12/1997 | Kushnick | |
| 6,081,484 A | 6/2000 | West | |
| 6,128,754 A | 10/2000 | Graeve et al. | |
| 6,178,206 B1 | 1/2001 | Kelly et al. | |
| 6,285,963 B1 | 9/2001 | West | |
| 6,346,907 B1 | 2/2002 | Dacy et al. | |
| 6,353,904 B1* | 3/2002 | Le | 714/726 |
| 6,456,959 B1 | 9/2002 | Kattan | |
| 6,501,706 B1 | 12/2002 | West | |
| 6,622,107 B1 | 9/2003 | West | |
| 6,678,643 B1* | 1/2004 | Turnquist et al. | 703/14 |
| 6,748,564 B1 | 6/2004 | Cullen et al. | |
| 6,859,902 B1 | 2/2005 | Dalal et al. | |
| 6,928,387 B1 | 8/2005 | West | |
| 6,940,271 B2 | 9/2005 | West | |
| 7,010,782 B2* | 3/2006 | Narayan et al. | 717/124 |
| 7,113,886 B2 | 9/2006 | West | |
| 7,212,941 B2 | 5/2007 | Sivaram et | |
| 7,222,280 B1 | 5/2007 | West et al. | |
| 7,336,066 B2 | 2/2008 | West | |
| 7,454,678 B2 | 11/2008 | Cullen et al. | |
| 7,483,824 B1* | 1/2009 | Hill | 703/14 |
| 2003/0139899 A1 | 7/2003 | West | |
| 2003/0229466 A1 | 12/2003 | Garcia | |

OTHER PUBLICATIONS

Sartori, L. et al., "The Path to One- Picosecond Accuracy," IEEE International Test Conference 2000, Atlantic City, NJ, USA, pp. 619-627 (Oct. 2000).

* cited by examiner

*Primary Examiner*—Christine T Tu (57) ABSTRACT

A method and system for performing diagnosing in an automatic test environment. The method begins by determining a fail condition during a test of a device under test (DUT). A diagnostic suite is determined for testing the fail condition. The diagnostic suite is generated if the diagnostic suite is not available for access.

20 Claims, 5 Drawing Sheets

TEST AND DIAGNOSIS OF SEMICONDUCTORS

CROSS REFERENCE TO RELATED U.S. APPLICATIONS

This application claims priority to provisional patent application Ser. No. 60/799,929, entitled "Advanced Test Methodology and Strategies for Semiconductors," with filing date May 12, 2006, and assigned to the assignee of the present invention, which is herein incorporated by reference in its entirety.

TECHNICAL FIELD

Embodiments of the present invention relate to testing integrated circuits and to scan-based testing of integrated circuits. More specifically, embodiments of the present invention are related to advanced test methodologies and strategies for test and diagnosis of integrated circuits.

BACKGROUND ART

The use of scan-based techniques for testing integrated circuit (ICs) has become essential as IC component (e.g. transistor) density has increased. One reason for this is that due to size constraints, component density has far outstripped the number of electrical connectors, typically referred to as input/output pins, capable of being built into an IC. Thus, a circuit tester testing IC functionality via a limited number of pins encounters increasing difficulty in adequately reaching the voluminous number of state permutations and transitions provided by increased integration.

As a result, modern ICs are typically equipped with scannable logic elements to facilitate testing. A typical scannable IC includes one or more sets of state-holding elements (registers) interposed between circuit components and/or between circuit components and input/output pins. During normal operation, the state-holding elements are transparent to or incorporated as part of the functionality of the IC. In test mode, they are configurable as a serial shift register, or "scan-chain," typically by linking the output of one state holding element to the input of another. The scan-chain permits scan test data to be serially shifted into and out of the state-holding elements via one or more input/output pins, thereby increasing the states reachable by a tester.

In a typical circuit test, a tester applies digital signal patterns to the pins of a device under test ("DUT"). The content, sequence and timing of test patterns are dependent on the architecture of the particular DUT, and are typically generated by the DUT manufacturer with the IC design software used for designing the DUT. There are two predominant types of test patterns used in the conventional art: scan test patterns and functional test patterns. Scan test patterns are bit patterns used to test selected subcircuits inside the device by establishing a particular one of many subcircuit states using a DUT's scan chain, followed by forcing a state transition from that state of the subcircuit to an expected second state, followed by verifying that the proper state transition occurred using the DUT's scan chain. Functional patterns are bit patterns typically applied in parallel to the input pins on the DUT to test functionality of the device as a whole. The bit patterns applied in parallel to the input pins of a device are called "functional test vectors" in the current art.

There are three predominant types of scan test patterns in the conventional art: a scan-in pattern, a scan-out pattern, and a scan-mask pattern. The scan-in pattern is the bit sequence serially shifted into a scan chain to configure the IC to a known starting state. The scan-out pattern is the bit sequence representing the expected state in a scan-chain resulting from the DUT's processing the scan-in patter. The scan-mask pattern is a bit pattern used for filtering out bits to be ignored in a particular scan test. The combination of the scan-in pattern, the scan-out pattern, and the scan-mask pattern is termed a "scan test vector" in the current art. An Automatic Test Pattern Generator (ATPG), of which many are well known in the art, is dominantly used to generate such scan-test vectors.

The steps in a typical scan test iteration are as follows: 1) the tester places the DUT in scan-test mode to configure the scannable logic into a scan-chain; 2) the tester serially shifts a scan-in pattern into the scan-chain with a scan clock via one or more DUT pins; 3) the tester switches the DUT to normal mode and applies one or more system clock signals to the DUT, possibly in combination with one or more functional patterns on the DUT input pins; 4) the DUT processes the test states in the scan-chain and the input pins; 5) the tester tests the states on the output pins, then switches the DUT back to scan-test mode; 6) the tester serially clocks out the states of the scan-chain with a scan clock for comparison with a scan-out pattern containing the expected results, ignoring states as indicated by the scan-mask pattern; and 7) the tester serially shifts in a new scan-in pattern with the scan clock, and repeats the above steps.

In the conventional art, a monolithic approach for storing and processing scan patterns predominates. In this approach, all of the scan patterns used in a test sequence are typically stored in sequential order in a contiguous block of tester memory, and the scan-out process that exhibits the results of one of the tests in the sequence overlaps the scan-in process of the next test in the sequence, thus reducing the overall test time. For each test scan-in pattern of the test sequence, the tester only reports whether the test passed or failed. Specifically, when a failure occurs in the test sequence, the captured test data does not coincide with predicted values. The failure is logged, and the next scan-in pattern is determined.

Known behaviors of small subcircuits inside IC's include photon emission and heating effects that behave slightly differently in the presence of defects than if the circuit is fabricated properly. Known detectors such as laser voltage probes or photon emission detectors can be used to sense such behaviors. In the current art, detailed diagnosis of failures makes use of the monolithic scan block by tediously extracting a failing scan vector from the monolithic block and repetitively executing that vector, perhaps in combination with a carefully and tediously constructed preconditioning set of functional vectors or scan vectors or both as may be required to repetitively force the same device or subcircuit state transition many hundreds or thousands of times in order to detect the slight differences that indicate the presence of a defect. The required repetition of a failing test to enable detection of these slight differences in behavior enables physical failure analysis (PFA), and is called a PFA loop.

However, the monolithic testing approach cannot easily vary the order of the scan-in test patterns in order to determine the proper voltage setting for each particular flash memory device during the test sequence. Also, the monolithic approach is unable to re-sequence scan patterns into new test sequences without reconstructing the entire monolithic combination of patterns. The monolithic approach lacks any level of indirection, or re-sequencing requiring new test scan-in patterns to be created and added to an overall test sequence.

SUMMARY OF THE INVENTION

An advanced method for test and diagnosis of integrated circuits is disclosed. Specifically, methods and systems are disclosed for performing diagnosing in an automatic test environment. In one embodiment, the method begins by determining a fail condition during a test of a device under test (DUT). A diagnostic suite is determined for testing the fail condition. The diagnostic suite is generated using an ATPG if the diagnostic suite is not available for access.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Reference will now be made in detail to the embodiments of the present invention, an automatic test equipment (ATE) architecture and method that is capable of diagnosing fail conditions. While the invention will be described in conjunction with the embodiments, it will be understood that they are not intended to limit the invention to these embodiments.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention provide an ATE system that is capable of diagnosing failure conditions during execution of a test sequence, in accordance with one embodiment of the present invention. Other embodiments of the present invention provide the above accomplishments and also provide for site independent testing, adaptive test sequencing, calibrating, tuning, characterization, and diagnosis of modern IC devices.

Figure 1:
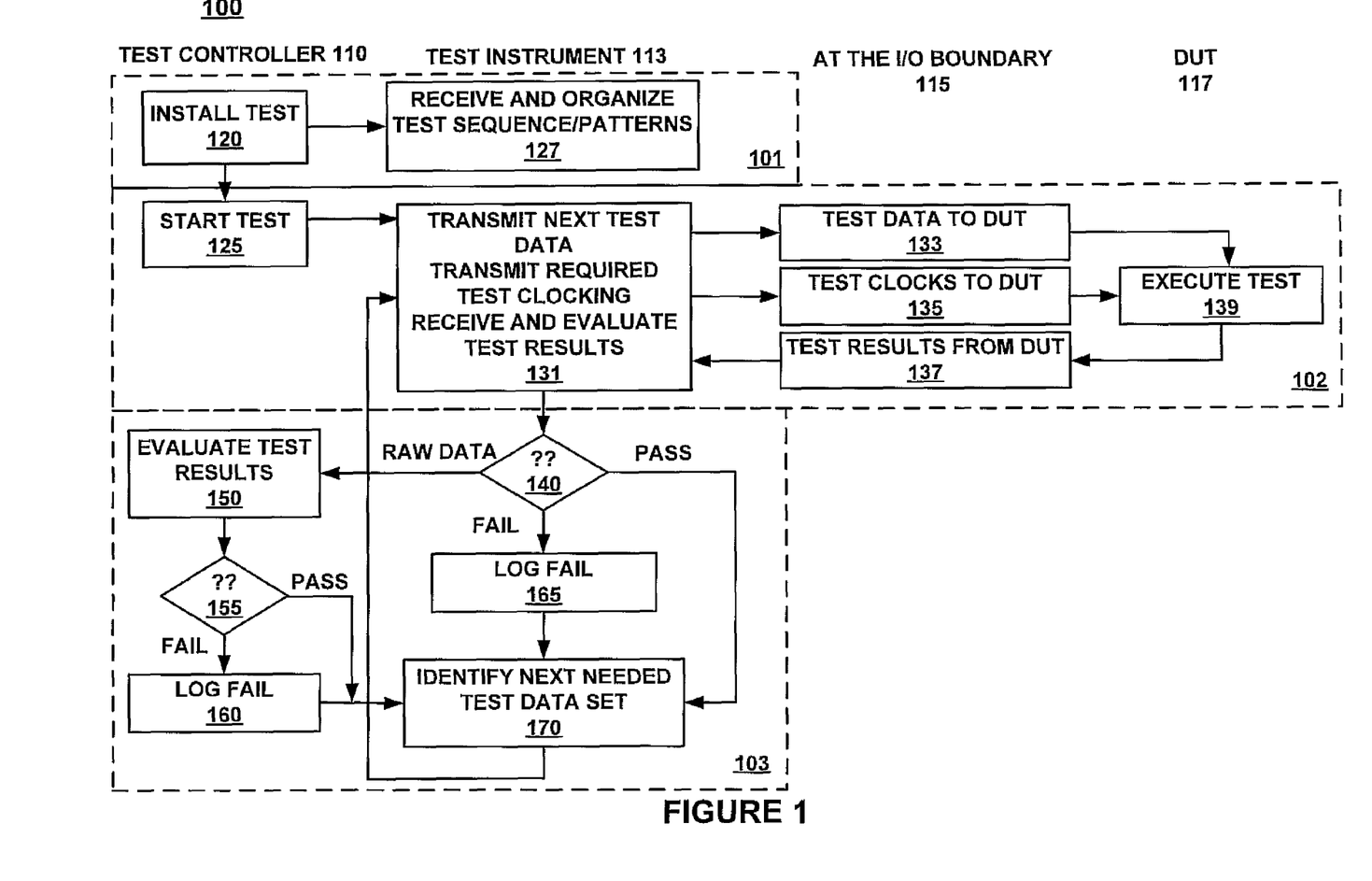
FIG. 1 is a flow diagram of a transaction based test, in accordance with one embodiment of the present invention.

FIG. 1 is a flow chart 100 illustrating a transaction based test approach, in accordance with one embodiment of the present invention. The key to successful ATE test application is the transaction based test approach outlined in FIG. 1. The test sequence applied in FIG. 1 is capable of going beyond the recording of a pass or fail condition. Specifically, some embodiments of the present invention are capable of performing circuit tuning (e.g., calibration), and retesting the circuit to verify the tuning operation was successful.

As shown in FIG. 1, the transaction based test approach is separated into four regions: the test controller 110, the automatic test instrumentation 113, the Input/Output (I/O) boundary 115, and inside the IC 117. The transaction based test approach outlined in FIG. 1 tests some part of the IC, or device under test (DUT), in on embodiment. For example, in complex systems on chips (SoCs), the transaction based test in flow diagram 100 is used to independently test individual cores of the SoC.

The transaction based approach consists of a series of three transactions: 1) establish state; 2) execute test; and 3) evaluate response to results. These three steps may overlap, and since different devices may require different tuning or calibration conditions, the response may not be the same from one device to the next device, or even to each of two similar devices being tested concurrently in a multisite test approach, as outlined in FIG. 1.

As shown in FIG. 1, blocks 101, 102, and 103 enable successive application of each set of the three transactions of a transaction based test set. For instance, the operations in block 101 install the stimulus and response patterns associated with each test in the sequence. The operations in blocks 102 and 103 execute each test in the test sequence, as follows. In block 102, the ATE transmits test data to the DUT to establish the state required inside the DUT to execute the test, the DUT executes the test, and the test results are transmitted to the ATE for evaluation. The operations in block 103 respond to the results of each test in the test sequence.

In particular, in the establish state block 101, the test controller 110 installs the test in operation 120. During installation, the ATE 113 receives and organizes the test patterns of the test sequence from the test controller 110 in operation 127.

Also, in the execute test block 102, the test controller 110 starts the test sequence in block 125. Thereafter, the test sequence is further executed when ATE 113 transmits the next test data (e.g., test vectors) to the DUT 117 through the I/O boundary at operation 133, thereby establishing the state required for the next test. Then, the test clocking is transmitted to the DUT 117 through the I/O boundary at operation 135. The test is executed in operation 139 in response to the test clocking and corresponding internal DUT activity according to its design. Thereafter, the test results from the DUT 17 are transmitted from the DUT 117 to the ATE 113 through the I/O boundary at operation 137. The ATE 113 receives and preliminarily evaluates the test results.

In the respond to results block 103, the ATE 113 evaluates the test results and determines whether the DUT 117 failed or passed the test pattern at decision step 140. If the test pattern passes, the next test data set, or test pattern, in the test sequence is identified at operation 170, and the test pattern is executed in block 102. On the other hand, if the test pattern fails, the fail condition is logged at operation 165 by the ATE 113.

In addition, the ATE 113 may determine to send the raw data to the test controller 110 for further analysis at operation 150. At decision step 155, the test controller 110 determines if the DUT 117 failed or passed the test pattern. If the test pattern passes, the next test data set is selected by the ATE 113 at operation 170. On the other hand, if the test pattern fails, then the fail condition is logged at operation 160 by the test controller 110. Thereafter, the next test pattern is identified by the ATE 113 at operation 170.

For example, in the case of a delay test in a full-scan device, the proper state is established by streaming in through scan-in pins the test vector of the test pattern that defines this particular delay test. The "execute test" means to issue (or enable the internal phase lock loop [PLL] together with its built in clock gating mechanism to issue) the launch and capture clock pair required for a delay test. Finally, "respond to results" means to collect the capture data serially via the scan-out pins, and compare them to values predicted by the automatic test pattern generator (ATPG) that generated the delay test pattern. Thereafter, whether the test pattern failed or passed is reported.

More generally, "establishing state" may include enabling a stimulus instrument, such as a radio frequency (RF) source, and "respond to results" may mean collecting a Sigma-Delta converted measurement of the sourced RF, filtering it, and processing it to determine its spectrum. Then another power level is either selected for the next RF test, or a signal is produced that indicates the test has failed and is stopping. Otherwise, if the test requirement includes an low noise amplifier (LNA) gain adjustment, the "respond to results" step may imply that another repetition of the entire sequence is needed following the gain adjustment.

Figure 2:
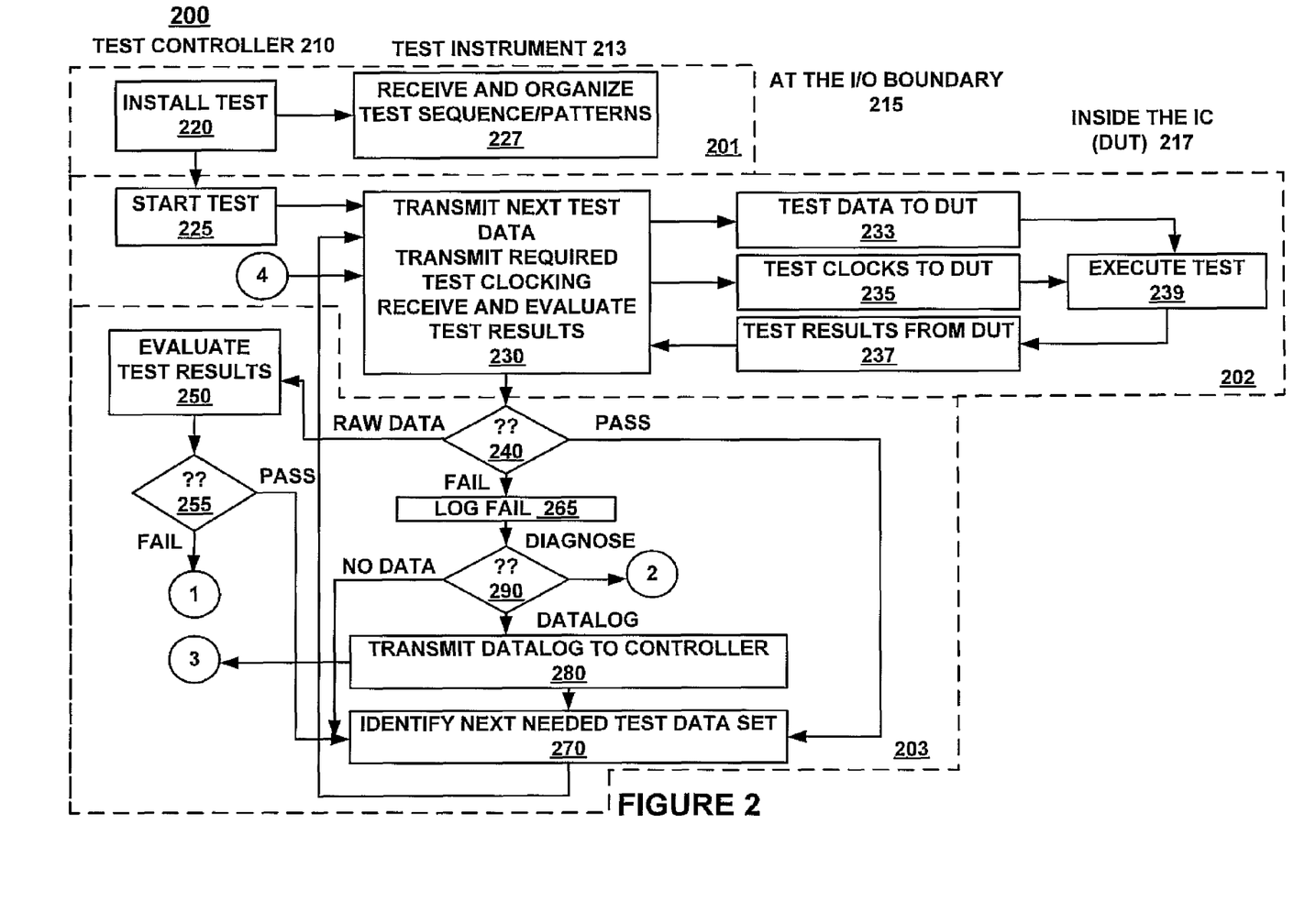
FIG. 2 is a flow diagram of a transaction based test including the capability of diagnosing failures, in accordance with an embodiment of the present invention.

FIG. 2 is flow chart 200 illustrating a transaction based test approach that is capable of diagnosing failures, in accordance with one embodiment of the present invention. As shown in FIG. 2, the transaction based test approach is implemented within the context of physical failure analysis (PFA) in one embodiment. However, other embodiments are well suited to implementing the transaction based test approach in any type of analysis flow. For example, the test sequence applied in FIG. 2 is capable of going beyond the recording of a pass or fail condition (e.g., the actual condition may have different content than a pass or fail condition). Specifically, embodiments of the present invention are capable of performing circuit tuning (e.g., calibration), and retesting the circuit to verify the tuning operation was successful.

The present embodiment supports PFA in two regards. First if the circuit activity is used to stimulate emissions or to allow sampling types of measurements, looping of subsets of the various tests is required. As such, embodiments of the present invention are able to prune and structure a portion of the test sequence so that it can loop fast enough to collect the required data in satisfactory period of time.

In addition, the present embodiment is able to localize the test sequence by enabling a series of targeted tests (e.g., generated by the ATPG in the test controller 210). As such, the ATE 213 is capable of selecting or creating the appropriate scan vectors to test a condition (e.g., a fail condition). In the present embodiment, the site-independent character of massive multisite ATE that is properly configured for PFA data collection would allow for a large number of devices to be tested and processed simultaneously.

As shown in FIG. 2, the transaction based test approach is separated into four regions: the test controller 210, the automatic test instrumentation 213, the Input/Output (I/O) boundary 215, and inside the IC 217. The transaction based test approach outlined in FIG. 2 tests some part of the IC, or device under test (DUT).

The transaction based approach consists of a series of three transactions: 1) establish state; 2) execute test; and 3) response to results. These three steps may overlap, and the response may not be the same from one device to the next device, or even to each of two similar devices being tested concurrently in a multisite test approach, as outlined in FIG. 2.

As shown in FIG. 2, blocks 201, 202, and 203 enable successive application of each set of the three transactions of a transaction based test set. For instance, the operations in block 201 install the stimulus and response patterns associated with each test in the sequence. The operations in blocks 202 and 203 execute each test in the test sequence, as follows. In block 202, the ATE transmits test data to the DUT to establish the state required inside the DUT to execute the test, the DUT executes the test, and the test results are transmitted to the ATE for evaluation. The operations in block 203 respond to the results of each test in the test sequence.

In particular, in the establish state block 201, the test controller 210 installs the test in operation 220. During installation, the ATE 213 receives and organizes the test patterns of the test sequence from the test controller 210 in operation 227.

Also, in the execute test block 202, the test controller starts the test sequence in block 225. In the operation 230, the ATE transmits the next test data, and also transmits the required test clocking. Thereafter, the test sequence is executed by having the ATE 213 transmit the next test data (e.g., test vectors) to the DUT through the I/O boundary at operation block 233, thereby establishing the state required for the next test. Then, the test clocking is transmitted to the DT through the I/O boundary at operation 235. The test is executed in operation 239 in response to the test clocking and corresponding internal DUT activity according to its design. Thereafter, the test results from the DUT are transmitted from the DUT to the ATE through the I/O boundary at operation 237. The ATE receives and preliminarily evaluates the test results back at operation 230.

In the respond to results block 203, the ATE evaluates the test results and determines whether the DUT failed or passed the test pattern at decision step 240. If the test pattern passes, the next test data set, or test pattern, in the test sequence is identified at operation 270, and the next test pattern is executed in block 202. On the other hand, if the test pattern fails, the fail condition is logged at operation 265 by the ATE.

In addition, the ATE 213 may determine to send the raw data to the test controller 210 for further analysis at operation 250. As such, off-line processing at the test controller 210 is performed. In this case, the raw data from the DUT (e.g., a repair or tuning message explicitly generated by the test block 202 and calibration circuitry) is delivered to test controller 210 for further analysis.

At decision step 255, test controller 210 determines if the DUT failed or passed the test pattern. If the test pattern passes, the next test data set is selected by the ATE 213 at operation 270. On the other hand, if the test pattern fails, then the present embodiment proceeds to point 1, as will be further described in relation to FIG. 3.

Returning back to operation 265, the present embodiment logs the fail condition at the ATE 213. Up to this point in the flow diagram 200, the operations performed by blocks 201 and 202 are analogous to those performed by blocks 101 and 102. However, the present embodiment as outlined in flow diagram 200 is capable of diagnosing fail conditions.

Figure 4:
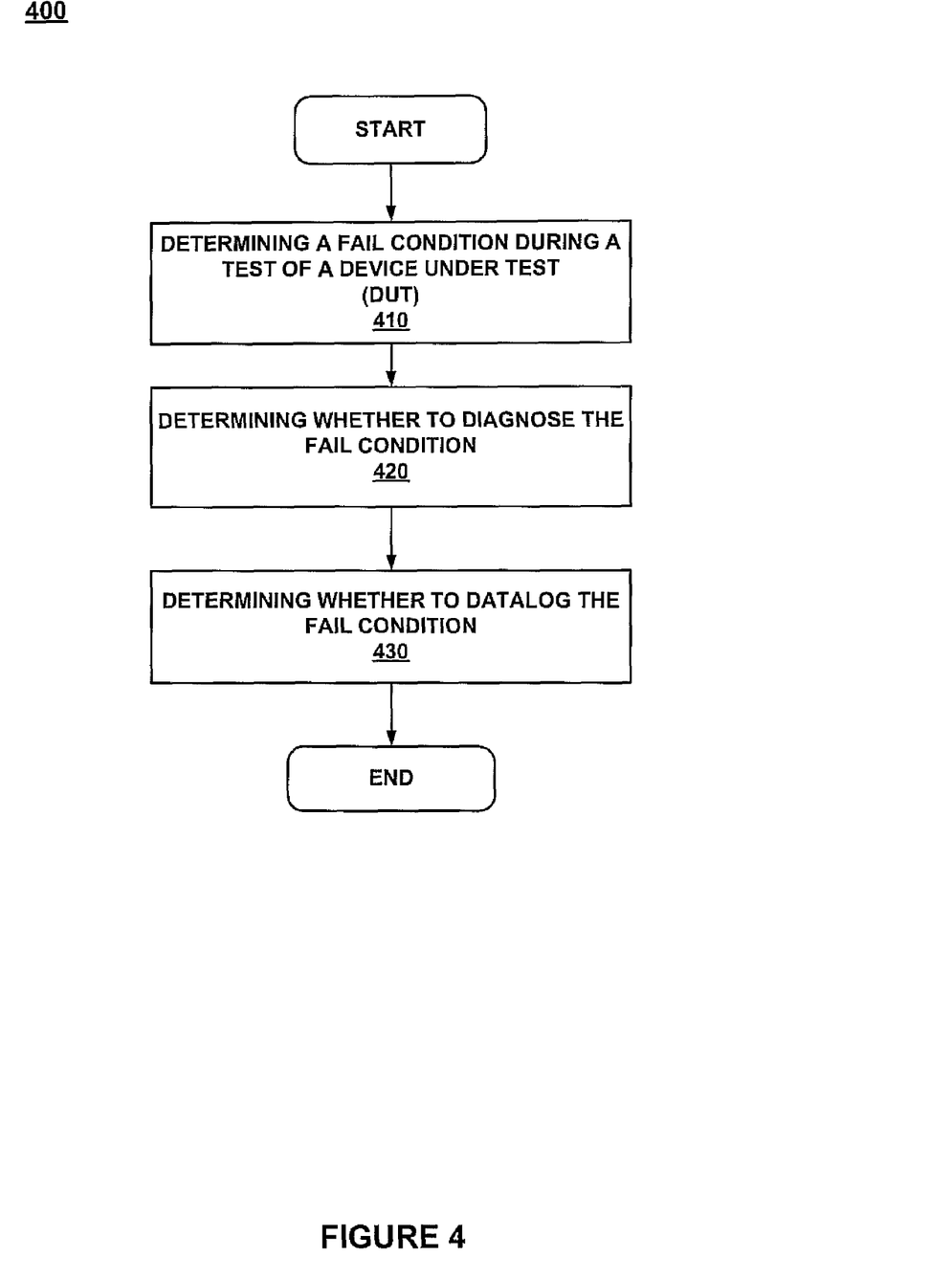
FIG. 4 is a flow diagram illustrating steps in a computer implemented method for diagnosing failure conditions in an automatic test environment, in accordance with one embodiment of the present invention.

As such, after the fail condition is logged at 265, the present embodiment performs a three-way decision at decision step 290, as will be described in relation to FIG. 4. FIG. 4 is a flow diagram 400 illustrating steps in a computer implemented method for a method of diagnosing in an automatic test environment implementing a scan chain test sequence that is performed in decision step 290 of FIG. 2, in accordance with one embodiment of the present invention.

At 410, the present embodiment determines at ATE 213 that a fail condition exists. The fail condition was produced during execution of one test step in a test sequence performed on a DUT. The operation at 410 is analogous to the operations at 240 and 265 of FIG. 2.

At 420, the present embodiment proceeds along one decision path to determine whether to diagnose the fail condition at the ATE 213. If the fail condition is to be diagnosed, the present embodiment proceeds to point 2 to diagnose the fail condition at the test controller 210 in order to determine the proper diagnostic suite, or test pattern, as will be more fully described in relation to FIG. 3.

At 430, the present embodiment proceeds along the other two decision paths out of decision step 290 to determine whether to datalog the fail condition at the ATE 213. If no datalog is to be performed, then the present embodiment, proceeds to operation 270 and identifies the next needed test data set, or test pattern. On the other hand, if the present embodiment decides to datalog the fail condition, the datalog entry is transmitted to the test controller 210 at operation 280, possibly for further diagnosis of the fail condition at point 3 by the test controller 213, as will be further described in relation to FIG. 3.

Figure 3:
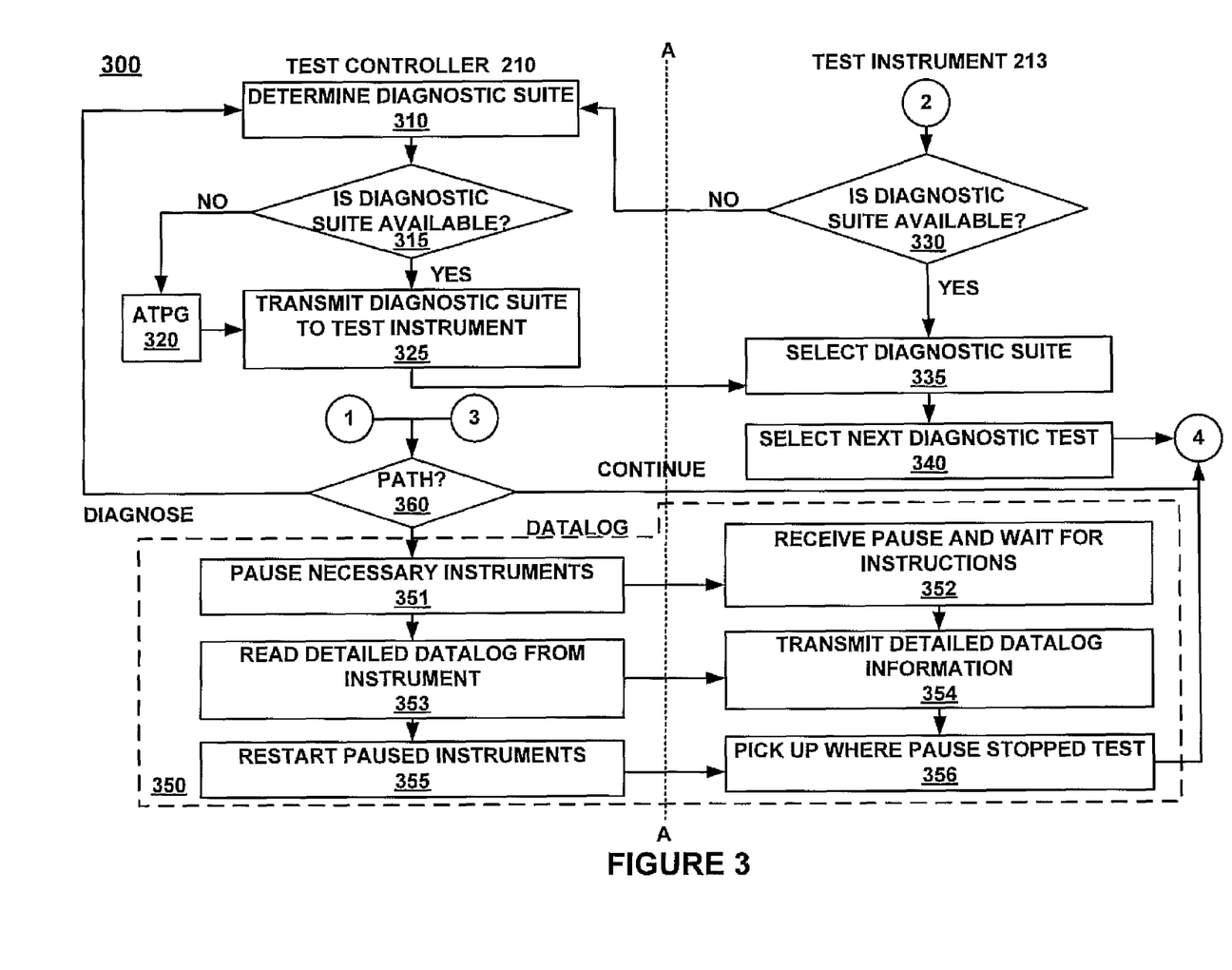
FIG. 3 is a flow diagram illustrating the generation of a test pattern for testing a failure condition, in accordance with one embodiment of the present invention.
Figure 5:
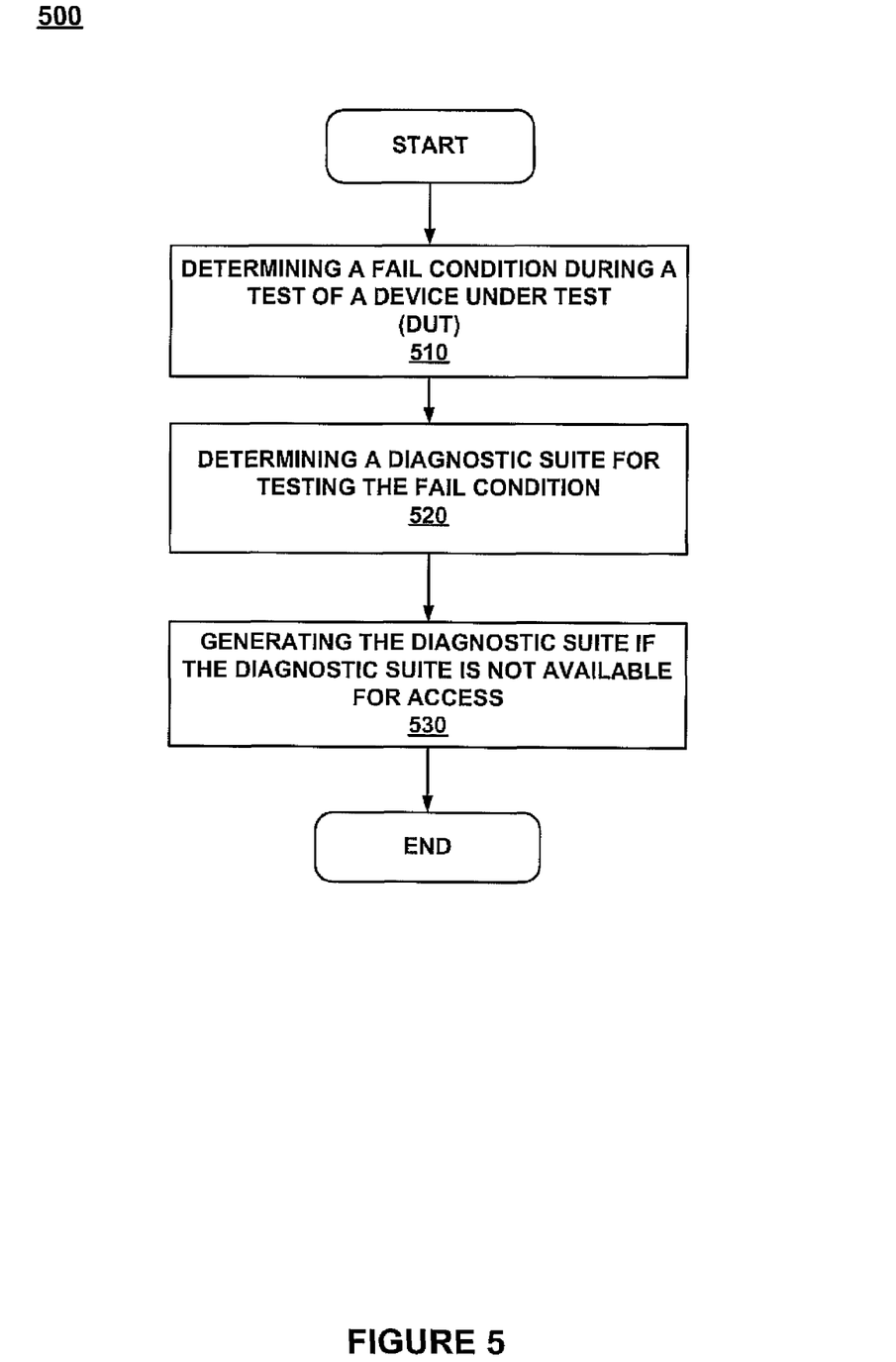
FIG. 5 is a flow diagram illustrating steps in a computer implemented method for generating a test pattern used in diagnosing a failure condition, in accordance with one embodiment of the present invention.

FIGS. 3 and 5 in combination illustrate methods of diagnosis in an automatic test environment, in which test patterns are generated, in accordance with one embodiment of the present invention. In particular, FIG. 3 is a data flow diagram 300 illustrating the flow of information when generating test patterns, in accordance with one embodiment of the present invention. FIG. 5 is a flow diagram 500 illustrating steps in a method for generating test patterns when diagnosing fail conditions, in accordance with one embodiment of the present invention.

Turning first to FIG. 5, the flow diagram 500 illustrates a method for diagnosing a fail condition that is capable of generating test patterns, in accordance with one embodiment of the present invention. The operations performed in FIG. 5 are performed by the ATE 213, or test controller 210, or a combination of both.

Specifically, at 510, the present embodiment determines a fail condition during a test of a DUT. This was performed previously at decision step 240 of FIG. 2.

At 520, the present embodiment determines a diagnostic suite for testing the fail condition. At 530, the present embodiment generates the diagnostic suite if it is not available for access. The operations performed in flow diagram 500 are more fully described below in relation to FIG. 3.

In FIG. 3, the data flow 300 shows the interplay between the test controller 210 and one of potentially several test instruments in the ATE 213 when key diagnostic routines are not part of the installed test suite of an ATE 213 when performing diagnosis of a fail condition. The operations performed by the ATE 213 and the test controller 210 are separated by the line A-A of FIG. 3.

Continuing from point 2 of FIG. 2, the ATE 213 has previously determined that a fail condition was generated during a test of a device under test (DUT). For instance, the fail condition was generated at decision step 240 of FIG. 2.

At operation 330, the ATE 213 determines a diagnostic suite that is appropriate for testing fail conditions in a limited fashion. That is, the ATE 213 is capable of determining a diagnostic suite that is available for access by the ATE 213. More specifically, the ATE 213 has the capability of assigning and determining diagnostic suites to test certain fail conditions that are associated with diagnostic suites that are installed directly on the ATE 213. In one embodiment, diagnostic suites comprise the test patterns, test vectors, and test data used to test various known fail conditions.

In this fashion, common fail conditions for the DUT may be quickly diagnosed and tested. As such, at 335, the present embodiment selects the diagnostic suite, and at 340 selects the next diagnostic test, or test pattern. The next diagnostic test is executed by proceeding to point 4 and continuing to the execute test block 202 of FIG. 2.

On the other hand, if the ATE 213 is unable to access or determine the appropriate diagnostic suite, then the ATE 213 enlists the help of the test controller 210 to determine the appropriate diagnostic suite to test the fail condition at operation 310. In particular, the ATE 213 sends the fail condition to the test controller 210, in one embodiment.

Thereafter, the test controller determines the appropriate diagnostic suite to test the fail condition at 310 of data flow 300. The test controller 210 is potentially capable of storing more diagnostic suites to test all known fail conditions, in one embodiment. For instance, in one embodiment, the test controller is a server based system.

The test controller 210 then determines if the diagnostic suite to test said fail condition is available for access by the test controller 210 at decision step 315. For instance, the test controller 210 determines if the diagnostic suite is stored by the test controller 210, in one embodiment.

If the diagnostic suite is available for access, then the test controller 210 accesses the diagnostic suite at the test controller, and transmits the diagnostic suite from the test controller 210 to the ATE system 213 for testing the fail condition at block 325.

On the other hand, if the diagnostic suite is not available, then the test controller 210 generates the diagnostic suite using an automatic test pattern generator (ATPG) at operation 320. Thereafter, the test controller transmits the diagnostic suite from the test controller 210 to the ATE system 213 for testing the fail condition at block 325.

Continuing from points 1 and 3 of FIG. 2 in FIG. 3, the test controller 210 determines a path of operation at decision step 360 when a fail condition determined by analyzing raw data from point 1, or through a datalog transaction from point 2, in accordance with embodiments of the present invention. The operation performed at decision step 360 is implemented using the operations in flow chart 400 of FIG. 4, in accordance with one embodiment of the present invention.

In particular, at decision step 360, the test controller 210 makes a three way decision either to diagnose, datalog, or continue with the test sequence. If no diagnostic action is called for by the test result, then the test controller continues with the test sequence and proceeds to point 4.

On the other hand, if the test controller determines to datalog the fail condition, the operations performed in block 350 are performed. Specifically, the test controller pauses the necessary instruments and the test sequence at operation 351. The pause is transmitted to the ATE 213. Then the ATE 213 receives the pause and waits for instructions. In addition, the test controller 210 reads the detailed datalog from the ATE 213 at 353 that are sent from the ATE at 354. At 355, the test controller restarts the paused instruments and continues with the test sequence.

The present embodiment is capable of performing further diagnosis from points 1 and 3. Specifically, from decision step 360, the test controller proceeds to 310 in order to diagnose the fail condition, in one embodiment as previously described. Thereafter, the diagnostic suite is determined and generated if necessary in operations 310, 315, and 320. The appropriate diagnostic suite is transmitted to the ATE system 213 at operation 325 for testing the fail condition. As such, the ATE 213 is able to select the next diagnostic test in the diagnostic suite in order to test the fail condition.

In one application, the methods and data flows of FIGS. 2, 3, 4, and 5 are implemented to diagnose fail conditions in a PFA loop. As such, the PFA loop is continually executed using the techniques of embodiments of the present invention. For instance, the present embodiment is capable of diagnosing the fail condition in the PFA loop, selecting the next diagnostic test in a diagnostic suite for testing the fail condition, generating the diagnostic suite if necessary using a ATPG, and executing the next diagnostic test in the PFA loop.

Accordingly, embodiments of the present invention provide a method and an ATE system that is capable of diagnosing failure conditions during execution of a test sequence, in accordance with one embodiment of the present invention. Other embodiments of the present invention provide the above accomplishments and also provide for site independent testing, adaptive test sequencing, calibrating, tuning, characterization, and diagnosis of modern IC devices.

While the methods of embodiments illustrated in flow charts 400 and 500 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A method of diagnosing in an automatic test environment, comprising:
    determining a fail condition during a test of a device under test (DUT);
    determining a diagnostic suite for testing said fail condition; and
    generating said diagnostic suite if said diagnostic suite is not available for access.

2. The method of claim 1, further comprising:
    determining whether to diagnose said fail condition;
    determining whether to datalog said fail condition; and
    determining whether to continue with said test if no diagnostic action is necessary.

3. The method of claim 2, further comprising:
    determining to diagnose said fail condition at an automatic test instrument (ATE) system.

4. The method of claim 2, further comprising:
    determining to diagnose said fail condition at a test controller.

5. The method of claim 1, wherein said determining a fail condition comprises:
    evaluating raw data from said test at a test controller to determine said fail condition.

6. The method of claim 1, further comprising:
    transmitting said diagnostic suite to an automatic test instrument (ATE) system for testing said fail condition.

7. The method of claim 1, further comprising:
    determining to diagnose said fail condition in a physical failure analysis (PFA) loop;
    selecting a next diagnostic test in said diagnostic suite for testing said fail condition; and
    executing said next diagnostic test in said PFA loop.

8. A method of diagnosing in an automatic test environment, comprising:
    determining a fail condition during a test of a device under test (DUT);
    determining whether to diagnose said fail condition; and
    determining whether to datalog said fail condition.

9. The method of claim 8, wherein said determining whether to diagnose said fail condition, comprises:
    determining to diagnose said fail condition; and
    determining a diagnostic suite that is available for access to test said fail condition.

10. The method of claim 9, further comprising:
    selecting said diagnostic suite;
    selecting a next diagnostic test in said diagnostic suite for testing said fail condition.

11. The method of claim 8, wherein said determining whether to diagnose said fail condition, comprises:
    determining to diagnose said fail condition at an automatic test equipment (ATE) system;
    sending said fail condition to a test controller;
    at said test controller, determining a diagnostic suite to test said fail condition;
    accessing said diagnostic suite at said test controller; and
    transmitting said diagnostic suite from said test controller to said ATE system for testing said fail condition.

12. The method of claim 8, wherein said determining whether to diagnose said fail condition, comprises:
    determining to diagnose said fail condition at an automatic test equipment (ATE) system;
    sending said fail condition to a test controller;
    at said test controller, determining a diagnostic suite to test said fail condition;
    generating said diagnostic suite if said diagnostic suite is not available for access; and
    transmitting said diagnostic suite to said ATE system for testing said fail condition.

13. The method of claim 8, wherein said determining a fail condition further comprises:
    analyzing raw data during execution of said test at a test controller to determine said fail condition.

14. The method of claim 8, wherein said determining a fail condition further comprises:
    receiving at a test controller a datalog of said fail condition from an automatic test equipment (ATE) system;
    determining to diagnose said fail condition at said test controller;
    at said test controller, determining a diagnostic suite to test said fail condition; and
    generating said diagnostic suite is said diagnostic suite is not available for access; and
    transmitting said diagnostic suite to said ATE system for testing said fail condition.

15. The method of claim 8, further comprising:
    determining to diagnose said fail condition in a physical failure analysis (PFA) loop;
    determining a diagnostic suite that is available for access to test said fail condition;
    selecting a next diagnostic test in said diagnostic suite for testing said fail condition; and
    executing said next diagnostic test in said PFA loop.

16. A system for diagnosing in an automatic test environment, comprising:
- a diagnosis module for determining to diagnose a fail condition generated during a test of a device under test (DUT);
- a diagnostic suite calculator for determining a diagnostic suite for testing said fail condition; and
- a diagnostic suite generator for generating said diagnostic suite if said diagnostic suite is not available for access.

17. The system of claim 16, further comprising:
- an automatic test instrument (ATE) comprising said diagnosis module; and
- a test controller comprising said diagnostic suite calculator and said diagnostic suite generator.

18. The system of claim 16, further comprising:
- a test controller comprising said diagnosis module, said diagnostic suite calculator, and said diagnostic suite generator.

19. The system of claim 16, wherein said diagnostic suite generator comprises an automatic test pattern generator (ATPG).

20. The system of claim 16, further comprising:
- a transmitter module for transmitting said diagnostic suite to an automatic test instrument for testing said fail condition.

* * * * *